United States Patent [19]

Tigelaar et al.

[11] Patent Number: 4,811,078
[45] Date of Patent: Mar. 7, 1989

[54] INTEGRATED CIRCUIT DEVICE AND PROCESS WITH TIN CAPACITORS

[75] Inventors: Howard L. Tigelaar, Allen; Roger A. Haken; Thomas C. Holloway, both of Dallas, all of Tex.

[73] Assignee: Texas Instruments Incorporated, Dallas, Tex.

[21] Appl. No.: 938,654

[22] Filed: Dec. 5, 1986

Related U.S. Application Data

[63] Continuation-in-part of Ser. No. 837,611, Mar. 7, 1986, and a continuation-in-part of Ser. No. 729,318, May 1, 1985.

[51] Int. Cl.$^4$ ............... H01L 29/78; H01L 27/02; H01L 29/34; H01L 23/43
[52] U.S. Cl. ............... 357/54; 357/23.5; 357/23.6; 357/51; 357/67; 357/71
[58] Field of Search ............... 357/23.5, 72, 67, 54, 357/51, 23.6

[56] References Cited

U.S. PATENT DOCUMENTS

| | | | |
|---|---|---|---|
| 3,879,746 | 4/1975 | Fournier | 357/54 |
| 4,004,259 | 1/1977 | Rai et al. | 357/23.5 |
| 4,178,605 | 12/1979 | Hsu et al. | 357/42 |
| 4,233,672 | 11/1980 | Suzuki et al. | 357/42 |
| 4,378,628 | 7/1983 | Levinstein et al. | 357/67 |
| 4,384,218 | 5/1983 | Shimotori et al. | 357/23.6 |
| 4,417,325 | 11/1983 | Harari | 357/23.6 |
| 4,491,860 | 6/1985 | Lim | 357/51 |
| 4,495,693 | 0/1985 | Iwahashi et al. | 357/91 |
| 4,502,209 | 3/1985 | Eizenberg et al. | 357/67 |
| 4,570,328 | 2/1986 | Price et al. | 357/65 |
| 4,605,947 | 8/1986 | Price et al. | 357/23.1 |
| 4,609,931 | 9/1986 | Koike | 357/23.13 |
| 4,613,883 | 9/1986 | Tihanyi | 357/59 |
| 4,630,086 | 12/1986 | Sato et al. | 357/54 |
| 4,674,174 | 6/1987 | Kishite et al. | 357/23.9 |
| 4,698,659 | 10/1987 | Mizutani | 357/42 |

FOREIGN PATENT DOCUMENTS

| | | |
|---|---|---|
| 60-55656 | 3/1985 | Japan . |
| 60-74556 | 4/1985 | Japan . |
| 61-35517 | 2/1986 | Japan . |
| 61-65470 | 4/1986 | Japan ............... 357/41 |
| 61-142739 | 6/1986 | Japan . |
| 61-226959 | 10/1986 | Japan . |
| WO82/03948 | 11/1982 | PCT Int'l Appl. ............... 357/71 |

OTHER PUBLICATIONS

H. Kaneko et al., "Novel Submicron MOS Devices by Self-Aligned Nitidat ion of Silicide (Sanicide)" TEP-M-85 (Dec. 1985) pp. 208-211.

Alperin, et al., "Development of the Self-Aligned Titanium silicide Process for VLSI Applications", *IEEE Transactions on Electron Devices*, vol. ED-32, No. 2, (Feb., 1985) pp. 141-149.

M. Wittmer, et al., "Applications of TiN Thin Films in Silicon Device Technology", *Thin Solid Films*, vol. 93 (1982) pp. 397-405.

C. Y. Ting, "TiN Formed by Evaporation as a Diffusion Barrier Between Al and Si", *J. Vac. Sci. Technol,* 21(1) (May/Jun. 1982) pp. 14-18.

(List continued on next page.)

*Primary Examiner*—J. Carroll
*Attorney, Agent, or Firm*—Rodney M. Anderson; Leo N. Heiting; Melvin Sharp

[57] ABSTRACT

A new integrated circuit structure, wherein a TiN thin film layer 129 and another patterned thin film layer 124 preferably comprising polysilicon are separated (in some locations) by a thin dielectric 132 to define capacitors. At various other locations, the TiN layers 129 also makes contact to the polysilicon layer 124 (which will be silicide-clad at these locations), makes contact to n+ substrate regions 134 and p+ substrate regions 136, and also to provide a contact pad for a third patterned thin film conductor layer which overlies the other two. One important class of embodiments provides a floating-memory cell. wherein the floating gate 120 is made of polysilicon, but the control gate 142 consists predominantly of titanium nitride. A novel process for forming the titanium nitride control gate 142 and simultaneously forming titanium nitride local interconnect lines 149 is also disclosed.

37 Claims, 3 Drawing Sheets

OTHER PUBLICATIONS

De La Moneda, "Self-Aligned silicide Buried contacts", *IBM Technical Disclosure Bulletin*, vol. 24, No. 7A (Dec. 1981) pp. 3454-3457.

V. L. Rideout, "Method of Fabricating MOSFET Integrated Circuits with Low Resistitivity Interconnection Lines", *IBM Technical Disclosure Bulletin*, vol. 23, No. 6 (Nov. 1980) pp. 2563-2566.

C. Y. Ting, "Silicide for contacts and Interconnects", *IEDM 1984*, pp. 110-113.

Devereaux C. Chen, et al., "A New Device Interconnect Scheme for Sub-Micron VLSI", *IEDM 1984*, pp. 118-121.

INTEGRATED CIRCUIT DEVICE AND PROCESS WITH TIN CAPACITORS

CROSS-REFERENCE TO RELATED APPLICATIONS

The following applications, filed simultaneously with the present application, described related subject matter: Ser. No. 938,653, filed Dec. 5, 1986, pending (TI-12310, entitled Device and Process with Doubled Capacitors); and Ser. No. 938,486, filed Dec. 5, 1986, pending (TI-12399, entitled SinglePolysilicon DRAM Device and Process); and Ser. No. 938,699, filed Dec. 5, 1986, pending (TI-12400, entitled Device and Process with TiN-gate Transistor).

The present invention is a continuation-in-part of Ser. No. 837,611, filed 03/07/86, pending (TI-11029A), and of Ser. No. 729,318, filed 05/01/85, pending (TI-11029).

BACKGROUND AND SUMMARY OF THE INVENTION

The present invention relates to integrated circuits and to methods for manufacturing them.

In a new class of integrated circuit fabrication processes taught by the grandparent application (Ser. No. 729,318, filed 05/01/85, pending (TI-11029)), a very novel local interconnect technology was set forth, which resulted in very conveniently produced titanium nitride local interconnect line. These lines can be routed to interconnect p+ substrate regions, n+ substrate regions, and polysilicon in any pattern desired, while also permitting self-aligned silicidation to occur to clad surfaces of exposed silicon substrate areas and also of exposed polysilicon lines with silicide, to improve their conductivity.

In most conventional processes for making floating-gate nonvolatile memories (EPROMs or EEPROMs), the floating-gate memory cells are formed using two separate polysilicon layer. The first layer is typically used only for the floating gates of the memory cells. The second layer is typically used for the control gates of the floating gate memory cells, and also for the gates of MOS devices (i.e. insulated gate field effect transistors) in the periphery. Sometimes the second layer will be silicided to improve conductivity.

In conventional processes for making dynamic random-access memories (DRAMs), the memory cells are formed using two separate polysilicon layer. The first layer is typically used for the gate of the pass transistor, and the second layer is typically used for the top plate of the storage capacitor.

Since thin film deposition steps and patterned etching steps are both significantly expensive process steps. it would be highly desirable to be able to fabricate such devices with a reduced number of polysilicon deposition and etching steps. This would provide reduced fabrication cost, which is most especially important in such "commodity" parts.

2.1 Process Simplification

In general, the present invention permits a process using only one polysilicon level to achieve many of the advantages which otherwise would require two levels of polysilicon. The EPROM cell just discussed is only one example of this general capability, which can be adapted to a tremendous variety of other devices. Another example is a DRAM cell which requires only a single level of polysilicon; such DRAM cells (of which two types are described below in detail) provide tremendous advantages of density and economy.

Similarly, another class of embodiments of the present invention permit a process using only two polysilicon levels to achieve many of the advantages which otherwise would require three levels of polysilicon. EEPROMs are only one example of this capability, which, again, can be adapted to a tremendous variety of other devices.

Yet another class of embodiments of the present invention permit a process using only two polysilicon levels to achieve many of the advantages which otherwise would require four levels of polysilicon. By using two silicidation steps and two interlevel dielectric deposition and patterning sequences in a two-poly process, two independent layers of TiN can be made available for capacitor plates, local interconnects, etc.

The present invention teaches that, as a particularly useful development of the technology taught in the grandparent application, titanium nitride formation can be used to drastically simplify the structure and fabrication of many structures which normally require two level of polysilicon, and in particular of floating-gate non-volatile memory structures. The present invention teaches that a non-volatile memory can be built using only one layer of deposited polysilicon. A patterned dielectric covers some areas of the polysilicon, so that the titanium metal in these areas does not form silicides during the reaction process, but will be converted to a thin film of titanium nitride, which is a very convenient conductor. However, where underlying silicon areas (either of substrate monocrystalline silicon or of polycrystalline silicon) were not protected by this thin dielectric from the deposited titanium, the nitrogen-atmosphere reaction step will form titanium silicide at all such locations. Wherever the titanium metal runs over field oxide or over other non-silicon materials, it will form titanium nitride. This titanium nitride will already be in ohmic contact with any area of exposed silicon it runs over. Thus, simply by patterning this titanium nitride layer, the equivalent of a second polysilicon layer with full buried contact capability is achieved. That is, this layer can make direct contact to n+ or p+ source/drain portions of the substrate wherever (in the periphery) is desired.

Thus, the present invention offers the significant advantage of simpler processing than conventional floating-gate memory fabrication methods.

The present invention offers the further advantage that the titanium nitride layer is typically thinner than the second polysilicon layer which can be left out of the process because of the presence of titanium nitride. That is, the bulk resistivity of titanium nitride is low enough that acceptable sheet resistance (for short interconnects) can be achieved for a relatively thin film of TiN (10 Ω/□ or better for a 1000 Angstrom thick TiN film).

The present invention offers yet a further advantage in that the diffusion barrier characteristics of TiN permit this layer to make contacts directly to n+ or p+ silicon or polysilicon, without any problems due to diffusion of dopants through the TiN interconnect to induce counterdoping. This is not the case, for example, with silicides in general.

2.2 Non-volatile Logic

Another crucial class of advantages of the present invention is that it permits non-volatile memory transistors to be inserted into existing VLSI logic processes with relatively minor modifications. This is tremendously advantageous in microprocessors and in "EPAL" logic.

In microprocessors it is highly advantageous to have at least a small amount of non-volatile memory on-chip. This capability gives the system designer a number of options for customization: for example, the non-volatile memory can be used to load system parameters in control applications; it can be used as a memory pointer for initialization (permitting easy recovery after crashes or power glitches); it can be used for bus reconfiguration; and also in a great variety of other ways. There is a tremendous demand for this capability among microprocessor designers, but to date it has not been used as often as it has been desired, partly because such great process modifications are normally required to fit conventional non-volatile device technology into a logic flow. Such process modifications may translate, from a designer's point of view, into additional design rule modifications, which may preclude compatibility of existing design software. Thus a key advantage of the present invention is in providing microprocessors with non-volatile memory on chip, which can be built easily and reliably.

An important class of semiconductor products is logic arrays, in which the interconnection of an array of active devices is defined by a custom final mask step (or alternatively by blowing fuses on-chip) to provide a high-speed logic array which is optimized to perform the function desired for the particular application. "EPAL" logic is a term currently used to refer to logic arrays where non-volatile memory elements are used in place of fuses. (The non-volatile devices used normally have essentially the same microstructure as those used in non-volatile memory parts, but the logic designer can regard the EPROM cell as a reprogrammable fuse that can be used to reconfigure some of the logic (typically in the AND plane) of a programmable logic array. Again, great advantages (from the system designer's point of view) can be achieved by integrating even a relatively small number of floating-gate devices into a logic array. One device can fulfill the needs of many different customers because it can be taken off the shelf and programmed with a different logic function for each customer. Moreover, such an "EPAL" can be fully tested prior to shipment. That is, logic test functions can be programmed into the device and then tested for full functionality. The device can then be erased and sent to the customer with 100% confidence that it will work. With fused parts, the test would blow fuses and render the part useless, so they cannot be fully tested prior to shipment. Thus, the present invention very advantageously enables logic arrays which contain non-volatile logic, without any great increase in process complexity or degradation in yield or density. Alternatively, the non-volatile devices may be used to perform all of the customization of the logic array, which is tremendously advantageous for prototyping and system development.

The present invention can also be applied to fabricate an EEPROM, i.e. an electrically erasable floating gate memory. (The term "EEPROM" is normally used for a class of floating gate memories which are programmed or deprogrammed by applying a bias which creates a large vertical electric field at the surfaces of the floating gate to induce electron tunneling into or out of the floating gate. By contrast, an EPROM is typically programmed using channel current under high drain bias to create hot electrons, and can only be deprogrammed by exposure to ultraviolet light.) To build an EEPROM cell, one conventional way is to include an area of extremely thin dielectric—substantially thinner than the main area of gate dielectric—under the floating gate to promote tunneling between the floating gate and the substrate. Alternatively, an additional thin film layer which underlies a portion of the floating gate can be used, preferably with surface asperities to promote tunneling, so that programmation and erasure both involve tunneling between the floating gate and another thin film layer. The present invention is readily applicable to fabrication of EEPROMs of the first type described, and may also be applied to build EEPROMs of other types, with advantageously reduced process complexity from that which would otherwise be required.

For microprocessors and logic array applications, it is even more advantageous if non-volatile memory which is electrically programmable and electrically erasable can be combined with the basic logic elements. All of the above advantages are obtained to an even greater degree, and such capability opens new areas of application. The inclusion of non-volatile memory in logic parts is tremendously useful for prototyping, small production runs, and user customization, but if programmation is one-way the number of bits of data which can be stored by in-service programmation cycles will be strictly limited by the number of non-volatile memory bits available. Where electrically erasable non-volatility is available, a much larger range of available uses can be made. For example, multi-processor systems can store their current configurations in non-volatile memory, so that glitches cannot cause loss of configuration, but the processor interconnect architecture is reconfigurable rather than hard-wired.

Thus, another crucial advantage of the present invention is that is permits electrically erasable non-volatile memory to be inserted into existing VLSI logic processes with relatively minor modifications. This is tremendously advantageous in microprocessors and in "EPAL" logic (which in this case might better be referred to as "EEPAL" logic).

Thus a key advantage of the present invention is in providing microprocessors with non-volatile memory on chip, which can be built easily and reliably without complex additional process steps.

The present invention also enables substantial advantages in logic arrays, since arrays which can be reconfigured in service can be built easily and reliably without complex additional process steps. For example, this may be especially useful in implementing knowledge-based systems where algorithms "learn".

2.3 Additional Structures Provided

In addition to the very powerful and generally applicable advantages of process simplification, the present invention also permits novel structures, which could not easily have been fabricated otherwise, to be included in conventional process flows without great process modifications.

The present invention also provides a replacement for the capacitor technology typically used in many analog circuits in the prior art. In the processes normally used for fabricating such circuits, a first thin film conductor layer (typically polysilicon) is used for the bottom plates of capacitors, and a second thin film conductive layer (typically also polysilicon, sometimes clad with a silicide) is used for the top plate of capacitors and is also used for the gates of MOS devices. Another class of embodiments of the present invention teaches that a single layer containing silicon—in particular, a single layer which consists essentially of silicon at its bottom boundary, to provide the advantageous electrical properties of a silicon/dielectric interface—is used for the bottom plate of capacitors and also for the gates of insulated gate field effect transistors. A titanium nitride thin film interconnected layer is used for the top plates of capacitors, and preferably also for local interconnect. The portions of the thin film titanium nitride layer which are used for local interconnect can link polysilicon, silicides, and crystalline silicon of any dopant level in any pattern desired. Again, this innovation provides improved topography and also simpler fabrication, resulting in higher yield and lower cost.

Another advantageous use of the TiN layer is to provide pads at the bottom of contact holes. Since the oxide etch chemistries normally used for contact etching are somewhat selective to TiN, this layer provides some protection against overetching when the contact etch step must etch contact holes of various thicknesses. In particular, the present invention makes it easier to etch contact holes to substrate and to the polysilicon layer simultaneously. Moreover, the TiN etch stop pads can be extended from the source/drain regions (in the moats) up onto the field oxide, so that the contact hole does not have to fall within the perimeter of the source/drain, but can overlap up onto the field oxide. This means that the source/drain patterns can be drawn smaller, providing a further advantage of the invention.

Yet another use of the TiN layer provided by the presently preferred embodiments of the present invention is to provide capacitors to substrate. Since the interlevel dielectric is patterned after the source/drain implants, these capacitors can be located over heavily doped diffusions, so their parasitic series resistance should not be large.

Yet another use of the TiN layer provided by the presently preferred embodiments of the present invention is to provide Schottky diodes to substrate. By screening the source/drain implant from some areas of bare silicon, the TiSi$_2$/TiN layer formed on these areas will provide usable Schottky diodes.

Yet another use of the TiN layer provided by the presently preferred embodiments of the present invention is to provide an additional group of MOSFETs with a different gate oxide thickness than the transistors which have their gates in the poly 1 level. This allows transistors with two different oxide thicknesses to be easily manufactured in a single integrated circuit device. The gate oxide thicknesses of the two groups of MOSFETs can be optimized independently to provide, for example, both highvoltage and low-voltage transistors on a single chip. For example, the TiN-gate devices can be used to control the high voltage needed for programmation of floating-gate memory cells (or, in some systems, to drive high-voltage output lines). The idea of TiN-gate MOSFETs, is believed not to be novel of itself (see, e.g., U.S. Pat. No. 4,605,947 to Price et al.); but this class of embodiments of the present invention is uniquely advantageous in providing transistors with independently optimizable characteristics as the result of a very simple process.

2.4 Process Versatility

Another way to regard advantages is that the present invention provides a tremendous step forward in process versatility.

One aspect of this is that the present invention units two objectives which had been separately pursued in the prior art; first, there is tremendous pressure to reduce the sheet resistance of interconnects. This has required the use of silicided lines in the prior art, in attempts to get the sheet resistance of the gate level down near or below 1 Ω/□. Second, there is need for higher complexity of interconnect. This second object has driven much of the work in local interconnects, where (because the average length of a local interconnect is relatively short) sheet resistance (below a certain level, e.g. 10 Ω/□ or so) is not nearly as critical as the connectivity and lateral spacing requirements. The present invention permits both of these partially conflicting requirements to be met using a single clad polysilicon level which is split in some locations to provide a local interconnect level with capability for high connectivity, and united in other locations to provide low sheet resistance.

A particularly serendipitous aspect of this is that, in the principal preferred embodiments, the sheet resistance of the united TiN/TiSi$_2$/polysilicon layer is substantially less than that which would be produced by the parallel combination of the two levels at the same geometry. For example, where 4500 Å of polysilicon and 1000 Å of titanium are initially deposited, the TiN layer apart from silicon will have a sheet resistance of about 10 Ω/□. and the polysilicon where it is not silicided will have a sheet resistance of about 25 Ω/□; but the clad polysilicon (polycide) will have a sheet resistance down in the neighborhood of 1 Ω/□.

Moreover, the present invention also resolves a second, analogous dichotomy regarding specific capacitance; as integrated circuits are inexorably pushed toward higher operating speeds, it is desirable to reduce parasitic capacitances, and particularly interlevel parasitic capacitances (which can not only generally degrade speed, but also induce logic faults by coupling level transitions between adjacent conductors). However, while interlevel specific capacitance is generally sought to be minimized, there are many circuits (both analog and digital) where high specific capacitance is needed, in order to configure a capacitor in a reasonable area. The present invention resolves this dichotomy too, using a single clad polysilicon level which is split in some locations to provide a high interlevel specific capacitance, and united in other locations to provide low sheet resistance and low parasitic capacitance.

Thus, using only a minimal process modification, the present invention advantageously permits some or all of the following device capabilities to be added to a conventional integrated circuit process:

Floating-gate memory cells can be built without adding an additional layer of polysilicon.

Nonvolatile programmable logic gates can be added to a logic circuit without adding an additional layer of polysilicon.

Floating-gate electrically erasable memory cells can be built without adding an additional layer of polysilicon.

Nonvolatile programmable and electrically erasable logic gates can be added to a logic circuit without adding an additional layer of polysilicon.

Capacitors (isolated from substrate) can be built without adding an additional layer of polysilicon.

The source/drain diffusions in the substrate can be cladded with a silicide/nitride layer to improve their sheet resistance.

A polysilicon gate layer can be cladded with a silicide/nitride layer to improve its sheet resistance.

Capacitors to substrate can also be provided with no additional process steps.

Schottky-barrier diodes to lightly doped substrate regions can also be provided with minimal additional process steps.

A second set of insulated gate field-effect transistors, having substantially different characteristics from the primary set of transistors, can also be provided with minimal additional process steps. In particular, this second set of transistors may advantageously be used to configure high-voltage drivers.

Local interconnects can be provided to directly link a polysilicon gate layer to adjacent source/drain (moat) areas.

Local interconnects can be provided to directly link an n++ polysilicon gate layer to adjacent p+ source/drain (moat) areas.

Local interconnects can be provided to directly link a polysilicon gate layer to both n+ and p+ source/drain (moat) areas.

Local interconnects can be provided to directly link n+ source/drain (moat) areas to p+ source/drain (moat) areas.

Contact etch stop pads can be provided on top of the polysilicon gate layer to improve the reliability of fabrication when contacts are etched both to polysilicon and to moat.

Contact etch stop pads can be provided on top of the source/drain diffusions to ensure that the contact etch does not cut through the corner of the field oxide to make contact to the channel stop diffusion.

Contact etch stop pads can be provided which overlap from on top of the source/drain diffusions over onto the field oxide, so the source/drain regions can be made smaller without risking that the contact etch might cut through the corner of the field oxide to make contact to the channel stop diffusion.

The net result of this process versatility is a tremendous advantage over a broad range of semiconductor parts, for at least two reasons. First, the capability to readily modify an optimal baseline process to achieve a wide variety of very different device structures means that new customer needs can rapidly addressed without the expense of developed a newly customized process. Second, design rules can also be standardized and made more compatible, so that portions of existing designs can be rapidly adapted for products of new types.

According to the present invention there is provided: A nonvolatile memory cell comprising; a transistor channel region; first and second source/drain regions abutting said channel region; a floating gate overlying and insulated from and capacitively coupled to said transistor channel region; and a control gate, consisting essentially of titanium nitride, overlying and insulated from and capacitively coupled to said floating gate.

According to the present invention there is also provided: A non-volatile memory cell comprising; a transistor channel region; a floating gate overlying and insulated from and capacitively coupled to said transistor channel region; a control gate, consisting essentially of titanium nitride, overlying and insulated from and capacitively coupled to said floating gate; wherein said floating gate is an island portion of a first patterned thin film conductive layer which consists of at least 30% atomic of silicon, and wherein said control gate is a portion of a second patterned thin film conductive layer which consists predominantly of titanium nitride, and wherein some portion of said second patterned thin film layer makes ohmic contact directly to some other portion of said first patterned thin film layer.

According to the present invention there is also provided: A non-volatile memory comprising; an array of floating-gate memory cells, each comprising a transistor channel region, a floating gate overlying and insulated from and capacitively coupled to said transistor channel region, and a control gate overlying and insulated from and capacitively coupled to said floating gate; and peripheral logic comprising a plurality of insulated-gate field-effect transistors connected to configure sensing circuitry; wherein said floating gates are respective island portions of a first patterned thin film conductive layer which consists of at least 30% atomic of silicon, and other portions of said first patterned thin film layer also constitute the gates of said insulated-gate field-effect transistors of said sensing circuitry; and wherein said control gates are respective portions of a second patterned thin film conductive layer which consists predominantly of titanium nitride.

According to the present invention there is also provided: A non-volatile memory comprising: an array of floating-gate memory cells, each comprising a transistor channel region, a floating gate overlying and insulated from and capacitively coupled to said transistor channel region, and a control gate overlying and insulated from and capacitively coupled to said floating gate; and peripheral logic comprising a plurality of insulated-gate field-effect transistors connected to configure sensing circuitry; wherein said floating gates are respective island portions of a first patterned thin film conductive layer which consists of at least 30% atomic of silicon, and other portions of said first patterned thin film layer also constitute the gates of said insulated-gate field-effect transistors of said sensing circuitry; and wherein said control gates are respective portions of a second patterned thin film conductive layer which consists predominantly of titanium nitride, and wherein some portion of said second patterned thin film layer makes ohmic contact directly to some other portion of said first patterned thin film layer.

According to the present invention there is also provided: A non-volatile memory comprising; an array of floating-gate memory cells, each comprising a transistor channel region, a floating gate overlying and insulated from and capacitively coupled to said transistor channel region, and a control gate overlying and insulated from and capacitively coupled to said floating gate; and peripheral logic comprising a plurality of insulated-gate field-effect transistors connected to configure sensing circuitry, said sensing circuitry including both p-type and n-type ones of said transistors (said p-type transistors comprising respective p+ source/drains and said n-type transistors comprising respective n+ source/drains); wherein said floating gates are respective island portions of a first patterned thin film conducive layer which consists of at least 30% atomic of silicon, and other portions of said first patterned thin film layer also constitute the gates of said insulated-gate field-effect transistors of said sensing circuitry; and wherein said control gates are respective portions of a second patterned thin film conductive layer which consists predominantly of titanium nitride, and wherein some portion of said second patterned thin film layer makes electrical connection from at least one said p+ source/-drain to at least one n+ source/drain.

According to the present invention there is also provided: An integrated circuit device comprising; a substrate; device isolation regions defining predetermined moat areas of exposed semiconducting material; a plurality of active devices near the surface of said moat areas, said active devices including portions of a first patterned thin film conductive layer; and a local interconnect layer comprising a patterned thin film consisting substantially of titanium nitride, some portions of said patterned local interconnect thin film interconnecting predetermined portions of said moat regions over said device isolation regions, and some portions of said patterned local interconnect thin film overlying a relatively thin thin film insulator over at least some respective portions of said first patterned thin film conductive layer to define capacitors.

According to the present invention there is also provided: An integrated circuit device comprising: s substrate; device isolation regions defining predetermined moat areas of exposed semiconducting material; a plurality of active devices near the surface of said moat areas, said active devices including portions of first patterned thin conductive layer; and a second patterned thin film conductive layer consisting predominantly of titanium nitride, some portions of said second conductive layer making ohmic contact to predetremined portions of said first conductive layer, and some portions of said second conductive layer overlying a relatively thin thin film insulator over at least some respective portion of said first patterned thin film conductive layer to define capacitors.

According to the present invention there is also provided: An integrated circuit device comprising: a substrate; device isolation regions defining predetermined moat areas of exposed semiconducting material; a plurality of active devices near the surface of said moat areas, said active devices including portions of a first patterned thin film conductive layer; and a second patterned thin film conductive layer consisting predominantly of titanium nitride, some portions of said second conductive layer making ohmic contact to predetermined portions of said moat areas, and some portions of said second conductive layer overlying a relatively thin thin film insulator over at least some respective portions of said moat areas to define capacitors.

According to the present invention there is also provided: An integrated circuit device comprising: a substrate; device isolation regions defining predetermined moat areas of exposed semiconducting material; a plurality of active devices near the surface of said moat areas, said active devices including portions of a first patterned thin film conductive layer; and a second patterned thin film conductive layer consisting predominantly of titanium nitride, some portions of said second conductive layer making ohmic contact to predetermined p+ portions of said moat areas, some portions of said second conductive layer making ohmic contact to predetermined n+ portions of said moat areas, some portions of said second conductive layer making ohmic contact to predetermined portions of said first conductive layer, and some portions of said second conductive layer overlying a relatively thin thin film insulator over at least some respective portions of said first patterned thin film conductive layer to define capacitors.

According to the present invention there is also provided: An integrated circuit comprising: a first conductive layer, said first conductive layer being polycrystalline and consisting essentially of silicon; a thin film dielectric overlying some but not all areas of said first conductive layer; a second conductive layer, consisting predominantly of titanium nitride, overlying at least a part of said dielectric at a location where said dielectric overlies said first conductive layer; wherein said first conductive layer further comprises an overlying layer comprising a metal silicide, said silicide layer overlying substantially all of said first conductive layer except where said thin film dielectric or said second conductive layer overlie said first conductive layer.

According to the present invention there is also provided: An integrated circuit capacitor comprising; a first conductive layer, said first conductive layer being polycrystalline and comprising more than 50% atomic of silicon; a thin film dielectric overlying at least part of said first conductive layer, at least some portion of said thin film dielectric near the interface with said first polycrystalline conductive layer consisting essentially of a material selected from the group consisting of; silicon dioxide (including near-stoichiometric compositional modifications thereof); silicon nitride (including near-stoichiometric compositional modifications thereof); and mixtures of the two; a second conductive layer, consisting predominantly of titanium nitride, overlying at least a part of said dielectric at a location where said dielectric overlies said first conductive layer.

According to the present invention there is also provided: A non-volatile memory cell comprising; a substrate having a semiconductor portion including a read transistor channel region; first and second source/drain regions abutting said channel region; a floating gate overlying a gate dielectric and being insulated from and capacitatively coupled to said transistor channel region through said gate dielectric, and also overlying a tunnel dielectric over said semiconductor portion; and a control gate, consisting essentially of titanium nitride, overlying and insulated from and capacitatively coupled to said floating gate.

According to the present invention there is also provided: A product produced by a process comprising the steps of; providing a substrate comprising monocrystalline silicon; providing device isolation areas in a predetermined pattern to define moat regions in predetermined locations; forming a first patterned thin film conductive layer which includes insulated gates running over predetermined locations in said moat regions to define transistors; providing a thin film insulator over at least some parts of said first conductive layer; depositing a metal consisting substantially of titanium overall; applying heat in a nitrogen-bearing atmosphere, so that said metal reacts with exposed silicon portions of said substrate to form titanium silicides, and other portions of said metal also react with said nitrogen atmosphere to form a material including a large fraction of titanium nitride; and etching predetermined locations of said titanium nitride layer to provide local interconnection in a predetermined pattern, while also leaving portions of said titanium nitride layer in place over at least some locations of said thin film insulator over said first patterned thin film conductive layer to define regions having a relatively high specific capacitance.

According to the present invention there is also provided: A product produced by a process comprising the steps of; providing a substrate comprising monocrystalline silicon; providing device isolation areas in a predetermined pattern to define moat regions in predetermined locations; fabricating insulated gate field effect transistors in predetermined locations in said moat regions, gates of said insulated gate field effect transistors being formed by portions of a first patterned thin film conductive layer; providing a thin film insulator over at least some parts of said first patterned thin film conductive layer; depositing a metal consisting substantially of titanium overall; providing a patterned thin film cap layer to cover some areas of said metal layer (said cap layer also covering portions of said metal layer over at least some locations of said thin thin film insulator over said first patterned thin film conductive layer in predetermined locations where a relatively high specific capacitance is desired), and heating said substrate and said metal in a nitrogen-bearing atmosphere, so that portions of said metal layer in contact with exposed silicon react to form titanium silicides, and portions of said metal exposed by said cap layer react with said nitrogen atmosphere to form a material having a large fraction of titanium nitride at the surface thereof; and etching away the reaction products of portions of said metal layer which were not covered by said cap layer nor in contact with silicon, to provide local interconnection in a predetermined pattern.

According to the present invention there is also provided: A process for fabricating integrated circuits, comprising the steps of; providing a substrate having monocrystalline semiconductor portions at at least some surface portions thereof, said semiconductor consisting predominantly of silicon; providing device isolation areas in a predetermined pattern to define separate moat regions in predetermined locations of said monocrystalline semiconductor; fabricating insulated gate field effect transistors in predetermined locations in said moat regions, gates of said insulated gate field effect transistors being formed by portions of a first patterned thin film conductive layer; providing a thin film insulator over at least some parts of said first patterned thin film conductive layer; depositing a metal consisting substantially of titanium overall; heating said substrate and said metal in a nitrogen-bearing atmosphere, so that said metal reacts with exposed portions of said substrate to form titanium silicides, and other portions of said metal also react with said nitrogen atmosphere to form a layer having a large fraction of titanium nitride at the surface thereof; and etching predetermined locations of said titanium nitride layer to provide local interconnection in a predetermined pattern, while also leaving portions of said titanium nitride layer in place over at least some locations of said thin thin film insulator over said first patterned thin film conductive layer to define regions having a relatively high specific capacitance.

According to the present invention there is also provided: A process for fabricating integrated circuits, comprising the steps of; providing a substrate having monocrystalline semiconductor portions at at least some surface portions thereof, said semiconductor consisting predominantly of silicon; providing device isolation areas in a predetermined pattern to define separate moat regions in predetermined locations of said monocrystalline semiconductor; fabricating insulated gate field effect transistors in predetermined locations in said moat regions, gates of said insulated gate field effect transistors being formed by portions of a first patterned thin film conductive layer; providing a thin film insulator over at least some parts of said first patterned thin film conductive layer; depositing a metal consisting substantially of titanium overall; providing a patterned thin film cap layer to cover some areas of said metal layer (said cap layer also covering portions of said metal layer over at least some locations of said thin thin film insulator over said first patterned thin film conductive layer in predetermined locations where a relatively high specific capacitance is desired), and heating said substrate and said metal in a nitrogen-bearing atmosphere, so that portions of said metal layer in contact with exposed silicon react to form titanium silicides, and portions of said metal exposed by said cap layer react with said nitrogen atmosphere to form a material having a large fraction of titanium nitride at the surface thereof; and etching away portions of said metal layer where not covered by said cap layer to provide local interconnection in a predetermined pattern.

According to the present invention there is also provided: A process for fabricating integrated circuits, comprising the steps of: providing a substrate having monocrystalline semiconductor portions at at least some surface portions thereof, said semiconductor consisting predominantly of silicon; providing device isolation areas in a predetermined pattern to define separate moat regions in predetermined locations of said monocrystalline semiconductor; fabricating insulated gate field effect transistors in predetermined locations in said moat regions, gates of said insulated gate field effect transistors being formed by portions of a first patterned thin film conductive layer which is polycrystalline and comprises more than 30% atomic of silicon; providing a thin film insulator over at least some parts of said first patterned thin film conductive layer; depositing a metal overall; heating said substrate and said metal, and etching away conductive reaction products thereof in a predetermined pattern, under conditions such that all portions of said semiconductor and of said first conductive layer which are in contact with said metal react to form silicides, and conductive reaction products of said metal are left in place to configure a second patterned thin film conductive layer, said second conductive layer having a relatively high specific capacitance to said said first conductive layer at all locations where said second conductive layer overlies said thin film insulator over said first layer.

BRIEF DESCRIPTION OF THE DRAWINGS

The present invention will be described with reference to the accompanying drawings, wherein.

DESCRIPTION OF THE PREFERRED EMBODIMENTS

The making and use of the presently preferred embodiments will now be discussed in great detail. However, it should be appreciated that the present invention provides widely applicable inventive concepts, which can be embodied in a tremendous variety of specific contexts; the specific embodiments discussed are merely illustrative of specific ways to make and use the invention, and do not delimit the scope of the invention.

4.1 Sample EPROM Process Flow

Figure 1A:
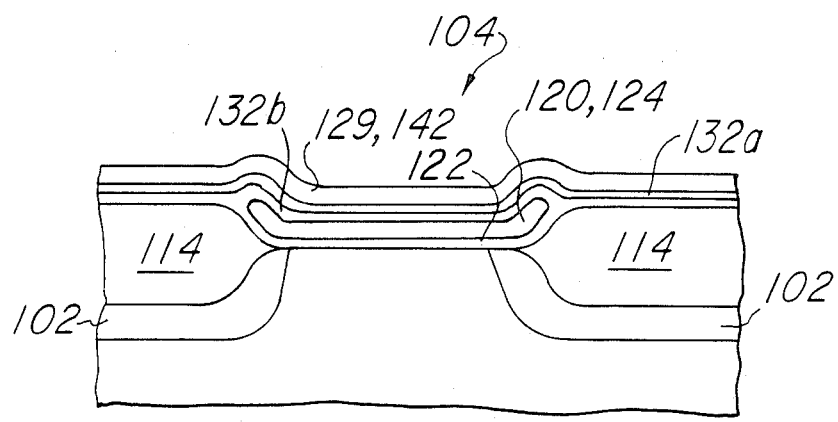
FIG. 1A shows a sample floating gate memory cell according to the present invention.

The process flow given here provides an EPROM like that shown in FIG. 1A, with buried-n+ lines 102 used as the source/drains of the floating-gate transistors 104. Routine and obvious steps, such as cleanups, bakes, ashes, and deglazes are generally not specifically detailed.

1. Tank formation: the following steps are used to define nwells (PMOS device regions) 106 and p-wells (NMOS active device regions) 108 for the peripheral devices:
   (a) The starting material is 12–15 Ω-cm p-type epitaxial material, which is 12–15 microns thick and has (100) orientation, on a P+ substrate (0.01–0.02 Ω-cm).
   (b) An oxide/nitride stack is formed and patterned, and Phosphorus is implanted (with the photoresist still in place) to form the n-wells 106.
   (c) A thick "color reversal oxide" is then grown to define the p-well pattern as (essentially) the complement of the n-well pattern, and the nitride is then stripped to expose clean bare silicon where not protected by the color reversal oxide.
   (d) Boron-11 is then implanted to form the p-wells 108, and the color reversal oxide is then stripped.
   (e) The tank implants are then activated and driven in.

2. Formation of moats (i.e. regions, surrounded by field oxide 110, where the peripheral active devices will be formed) now proceeds.
   (a) Silicon nitride is now deposited and etched in a pattern which leaves nitride in the regions where active devices will be formed (and also over the entire array of non-volatile memory transistors 104), and Boron-11 is implanted to form the channel stop 112 under the field oxide regions 110.
   (b) A 900 C steam oxidation step is then performed to grow 9500 Å of oxide, which will form the field oxide isolation regions 110 which separate the moat regions from one another. (Note that these field oxidation regions 110 are used only in the periphery; the self-aligned thick oxides 114 which form the bitline insulator strips over buried n+ regions 102 in this embodiment will be formed later.)

3. The bitline diffusions 102 will now be formed.
   (a) The buried n+ pattern is defined in photoresist, to expose the locations of the bitline diffusions 102.
   (b) A plasma etch is now used to clear the remaining nitride from the bitline diffusion locations, and Arsenic is implanted (e.g. 50 keV, 5.0E15 cm$^{-2}$) to form the bitline diffusions 102.
   (c) The implanted n+ regions are then annealed, and a self-aligned thick oxide 114 is grown, by 100 minutes in Argon at 900 C, followed by a 900 C steam oxidation for long enough to grow 4500 Å of oxide over the buried n+ regions (about 40 minutes).
   (d) The remaining nitride is then stripped, using a 1% HF deglaze followed by hot phosphoric acid, and the pad oxide under the nitride is also stripped using a quick dip in 1% HF.

4. The gates of the peripheral devices 116 and 118, and the floating gates 120 of the floating-gate non-volatile transistors 104 in the memory array, will now be formed.
   (a) A dummy gate oxidation (anti-Kooi-effect oxidation) is now performed at 900 C in steam, to grow 350 Å of oxide.
   (b) Photoresist is now patterned to mask the first threshold voltage adjusting implant ($V_{TA}$-adjust), and the threshold voltages of the floating-gate transistors 104 are adjusted by appropriate implantation.
   (c) The photoresist is stripped (e.g. in $H_2O_2/H_2SO_4$).
   (d) The dummy gate oxide is stripped in a 1% HF dip. (In this and other deglaze steps, the time in HF is preferably minimized to avoid excessive loss of the thick oxide over buried n+ (the bitline isolation oxide)).
   (e) A gate oxidation step is now performed, at 900 C in steam, to form 400 Å of oxide 122.
   (f) Boron-11 is now implanted (35 keV, 5E11 cm$^{-1}$) to adjust the thresholds of NMOS devices in the periphery.
   (g) Photoresist is now patterned to expose only the channels of PMOS devices, and boron-11 is again implanted (35 keV, 9E11 cm$^{-2}$) to adjust the thresholds of PMOS devices in the periphery.
   (h) The photoresist is stripped.
   (i) The first patterned thin film conductor layer 124 is now formed, by LPCVD deposition of polysilicon to a thickness of 3000 Å, and doped to 100 Ω/□ by 20 minutes in a POCl$_3$ atmosphere at 850 C.
   (j) Photoresist is now patterned to define the gates 126 of NMOS devices 116 in the periphery, gates 128 of PMOS devices 118 in the periphery, and the floating gates 120 of the non-volatile transistors 104 in the memory array, and the polysilicon level is etched (using, e.g., an HCl/HBr plasma etch chemistry) accordingly. The remaining photoresist is then stripped.
   (k) 2500 Å of oxide is then deposited by LPCVD from a vapor containing tetraethylorthosilane, and anisotropically etched to form sidewall filaments 130 shown) of almost 2500 Å maximum thickness.
   (l) An interlevel dielectric 132 is now deposited by LPCVD in a single step at 800 C: 150 Å of oxide 132a is followed by 250 Å of nitride 132b.

5. Source/drain regions 134 and 136 in the periphery will now be formed.

(a) Photoresist is patterned to expose the source/drain regions 134 of the NMOS devices in the periphery, and As is implanted (150 keV, 5E15 cm$^{-2}$) followed by P (100 keV, 4E14 cm$^{-2}$).

(b) Another patterned photoresist layer is now used to expose the PMOS source/drain regions 136, and boron-11 is implanted (40 keV, 3.0E15 cm$^{-2}$).

(c) The photoresist is now stripped.

(d) The source drain implants are annealed by a 900 C furnace treatment (Ar for 60 minutes, then O$_2$ for 30 minutes, then Ar for 10 minutes).

(e) The interlevel dielectric 132 is now etched away in the periphery, using a mask which covers the whole array. If capacitors are desired outside the array, the interlevel dielectric 132 is simply left in place over the first patterned thin film conductor layer 124 in those locations.

(f) Photoresist is then stripped.

6. The TiN layer 129 will now be formed, to provide local interconnects 140 in the periphery and to form the control gates 142 of the non-volatile transistors 104 in the array.

(a) 1000 Å of pure titanium is deposited overall.

(b) A silicon nitride/silicon dioxide cap layer (e.g. 400 Å Si$_3$N$_4$ over 800 Å SiO$_2$) is deposited overall.

(c) The wafer is heated (e.g. to 675 C for 30 min) to cause TiSi$_x$ 144 to form on areas where the titanium is in contact with silicon.

(d) The nitride/oxide cap layer is plasma etched so that it protects the conductive titanium compounds beneath it in desired locations of local interconnects 140, and also in the predetermined locations of control gates 142 in the memory array. (As discussed below, the titanium in these locations will be an oxygen-doped titanium-rich off-stoichiometric titanium nitride.) This single patterned etch step defines locations of control gates (of non-volatile memory transistors), local interconnects, and (if used) capacitors.

(e) The unreacted titanium (an nitride/oxide filaments) are selectively stripped by wet chemical etch.

(f) A p-type bitline isolation implant (which will be self-aligned, i.e. screened by the bitline insulator strips (thick oxide) and by the TiN wordlines) is now performed, to provide increased p-type doping to separate adjacent transistors in the same column.

(g) Photoresist is then stripped, and the wafer is annealed (800 C, 30 min, nitrogen atmosphere) to lower the sheet resistance of the silicides 144.

(h) A conformal oxide layer is now deposited overall, e.g. 1000 Å of TEOS oxide, to prevent outdiffusion of dopant species from the following the MLO layer into the contacts.

7. Contacts are now formed.

(a) The MLO 146 is deposited: for example, a borophosphosilicate glass (BPSG) containing approximately 4.5% boron and also about 4.5% phosphorus is used.

(b) A 900 C furnace step (30 minutes in argon) is used to densify the BPSG 146.

Figure 1B:
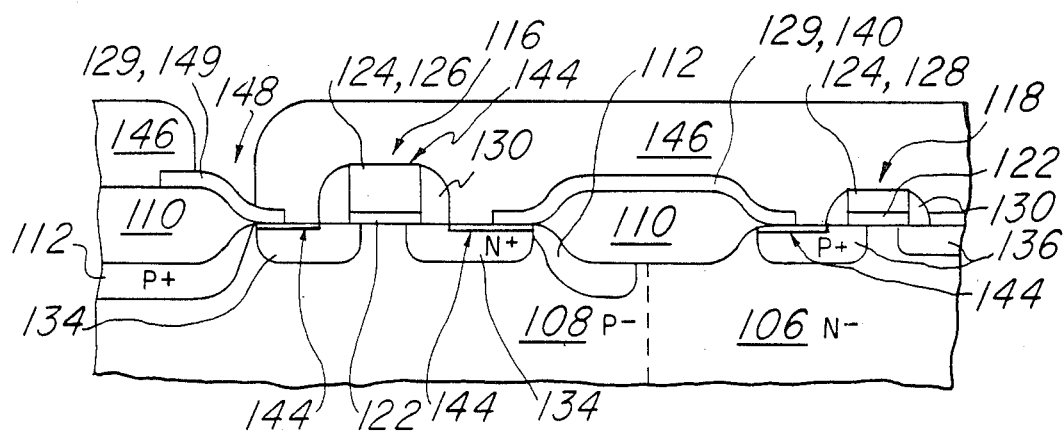
FIG. 1B shows a sample embodiment of CMOS peripheral logic devices, which are integrated on a common chip with an array of memory cells such as that shown in FIG. 1A to provide addressing and sensing logic.

(c) Photoresist is applied and patterned to expose the locations of contact holes 148, the contact holes are etched, and the remaining resist is stripped. Note that this step too applies principally to the periphery: there are preferably no contacts in the memory array, except for occasional metal to TiN contacts used for strapping the word lines. Preferably contact pads 149 (provided by patterned portions of the second patterned thin film conductive layer (local interconnect layer) 129, which preferably comprises a large fraction of titanium nitride to advantageously provide an etch stop and diffusion barrier) are included at the bottom of contact holes 148, as shown in FIG. 1B.

8. Processing continues conventionally with metal patterning, for the peripheral devices only.

(a) A deglaze in 1% HF is used to get good metal adhesion, and metal is then deposited by sputtering.

(b) A dyed photoresist is deposited and patterned, the metal is plasma etched, and the resist is stripped.

(c) The structure is heated to 450 C in H$_2$ for 30 minutes to sinter the metal and lower its contact resistance.

9. A protective overcoat is now formed:

(a) 4500 Å of oxynitride dielectric is deposited overall by LPCVD.

(b) The protective overcoat is covered with a patterned photoresist and etched away to expose metal at contact pad locations, and the photoresist is stripped.

10. Processing concludes with backgrind and backside gold deposition.

Figure 1C:
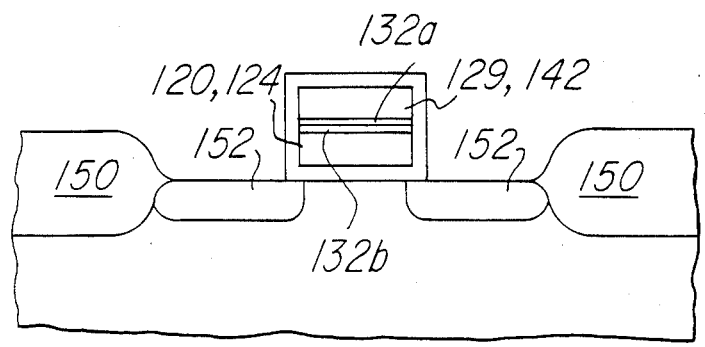
FIG. 1C shows another sample floating gate memory cell according to the present invention.

This process can also be modified to produce an EPROM cell like that shown in FIG. 1C. In this case the source/drains 152 are formed within moat regions patterned in LOCOS field oxide 150 (which may optionally be the same as field oxide 110 used in the periphery), and the source/drains are self-aligned to the stack of floating gate 124 and control gate 142. The buried n+ diffusions for source and drain are not necessary in this type of EPROM.

4.2 Sample EEPROM Embodiments

To build an EEPROM using the present invention, essentially the same steps as used to build conventional EEPROMs (of the type which have only a single thin-film level of control gates) will be used until fabrication of the floating gate, and steps like those in the detailed process flow above are used to form the floating gates, control gates, local interconnects, and (optionally) silicide-clad peripheral logic. That is, for example, to build the structure of FIG. 3, after the gate oxides 302 for the non-volatile transistors 304 have been grown (e.g. to 300 Å), photoresist is patterned on the gate oxide 302, and an ion implantation is performed to introduce additional dopants 306 into the predetermined locations where tunnel oxides 308 will be formed later. An oxide etch now removes the gate oxide 302 from the exposed (tunnel oxide) locations, and a second short oxidation is performed to grow a thin oxide 308 (e.g. 70-100 Å thick) on the tunnel oxide locations. (This oxidation step will also thicken the gate oxides 302 slightly.) Polysilicon 120' is now deposited and etched in a pattern to form t he floating gates 124', as well as (preferably) the gates of peripheral transistors. An interlevel dielectric 132 is formed, to cover the floating gates 124' as well as other areas, and the control gate 142' is then formed from the same material 129 used to make local interconnects (preferably titanium nitride, as described above). Processing then continues conventionally, using steps such as (for example) those described above.

Alternatively, another type of EEPROM, which normally requires a triple-poly process, can be built using the present invention with two levels of polysilicon

4.3 Sample Embodiments with TiN-gate Transistors

Figure 5:
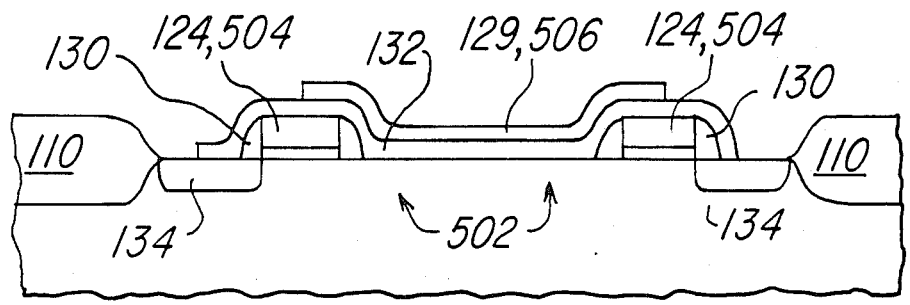
FIG. 5 shows a sample insulated gate field effect transistor, according to some embodiments of the present invention, where the gate consists predominantly of titanium nitride, and (in the example shown) a split-gate structure is used.

One of the optional process modifications taught by some versions of the present invention is to also use the TiN layer (or lcoal interconnect layer) to form the gates of insulated gate field effect transistors. A sample structure for doing this is shown in FIG. 5.

Fortunately, the work function of titanium nitride is close enough to that for n+ polysilicon that TiN can be used as the pass gate for an insulated gate field effect transistor having its channel in bulk silicon without having to use extreme or very unusual $V_T$-adjust dopings or back-bias conditions.

It should be noted that, if in-situ reacted titanium is used as the source of the titanium nitride, the gate dielectric for the TiN-gate IFGETs is preferably an oxide/nitride stack (like the interlevel dielectric described above) or graded composition dielectric, or else simply a nitride layer, to avoid any risk that a silicon dioxide gate dielectric would react significantly with titanium at the temperatures most preferably used for the silication reaction. However, oxide dielectrics may less preferably be used for these transistors, if they are thick enough.

Thus, the most preferred embodiment of this class of embodiments uses a nitride/oxide stack both for the gate dielectric of TiN-gate transistors and also for separating the TiN layer from the polysilicon layer to define floating-gate memory cells or capacitors.

Less preferably, instead of forming TiN as a reaction product, sputtering or evaporation or chemical vapor deposition may be used to deposit TiN. The lower temperatures which can be used in such variations mean that the risk of reaction with the gate oxide is avoided, especially when a stoichiometric TiN layer is deposited at temperatures below the temperature at which it reacts with SiO$_2$. Many of the advantages of process simplification and versatility discussed above would be sacrificed in this case; but it should be noted that this may provide a preferably way to fabricate a structure like that of (e.g.) FIG. 5.

As noted, such TiN-gate devices may be used to configure high-voltage transistors (while reserving the silicon-gate transistors for low-voltage logic), or, conversely, the TiN-gate devices may be used for logic and the silicon gate devices for high voltage. A sample embodiment where TiN-gate devices are used for high-voltage devices is shown in FIG. 5. Such devices may be useful in the periphery of EEPROM arrays, to handle the extremely high voltages which are useful for programming EEPROMs. The device shown in FIG. 5 may be fabricated in the same process sequence as the low-voltage devices of FIG. 1B and the EEPROM memory cell of FIG. 3 (or the EPROM memory cell of FIG. 1A).

In the example of FIG. 5, the high-voltage transistor 502 is configured as a split-gate device. That is, two segments 504 of the first patterned conductive layer 124 (polysilicon in this example) run across the moat at either side of the the gate 506 (which is formed as a portion of the local interconnect layer (second patterned thin film conductive layer) 129), and separate the edge of the gate 506 from the source/drain regions 134 (to avoid too high electric fields being induced at the source/drain boundaries by voltages applied to the gate 506). The gate dielectric under the gate 506 of this high-voltage device is provided by interlevel dielectric 132 (an oxide/nitride stack, in this example), and the gate edge barriers 504 are underlain by a thin oxide dielectric which is preferably part of the same thin film layer as that which provides the gate dielectrics of the peripheral devices shown in FIG. 1B.

The gate edge barriers 504, with their sidewall oxides 130, provide a reproducible spacing between the gate 506 and the source/drain diffusions 134. (In this example, where CMOS peripheral devices are used and source/drain counterdoping is not used, no additional masking steps are required in order to form these source/drain diffusions 134 on only one side of the gate edge barriers 504: since one or both of the source/drain implants must be masked anyway (to differentiate NMOS source/drain regions 134 from PMOS source/drain regions 136), a masked source/drain implant is used to form the source/drains of highvoltage transistor 502. However, the edge of the mask for this patterning step runs along the gate edge barriers 504, so that moderate misalignment of this mask has no effect on the $L_{eff}$ of high-voltage transistor 504.) Moreover, if steps to produce lightly-doped drain structures are included in the process flow (e.g. to produce a region of intermediate doping level under the sidewall oxides 130 of the NMOS logic transistors 116), these lightly-doped drain structures will also appear under the sidewall oxides 130 of the high-voltage transistors 502, further improving immunity to hot-carrier induced degradations.

Preferably (depending on the operating voltages used in highvoltage devices 502) the gate-edge extensions 504 are merely capacitively coupled to the gate 506; the specific capacitance between overlapping portions of these two layers will be reasonably high, so that the potential of the gate-edge extensions 504 will partially track the swing of gate 506, and thus naturally provide a reduced potential near the drain edge to reduce hot-carrier effects. The price of this protection against hot-carrier effects will be some added series resistance, but this is often a secondary concern in high-voltage integrated devices. The overlap of gate 506 onto approximately the middle of the gate-edge extensions 504 will provide some capacitive coupling; if close coupling is desired (to achieve greater voltage swing on gatedge extensions 504), a capacitor pad can be added on field oxide 110 near the high-voltage device 502. (Conversely, if it is desired to induce less voltage swing on the gate-edge extensions, they can be given additional capacitive coupling in the other direction, e.g. by extending them onto moat areas where they are not overlain by the gate.) Moreover, if even greater protection against hot carrier effects is desired (at the price of increased series resistance), the gate-edge extensions 504 can be patterned to a width which is greater than minimum geometry.

Optionally, where gate-edge extensions are used on both ends of the gate, the two gate-edge extensions may be DC-isolated from each other (although of course they will be capacitively coupled, since they are both coupled to the gate). The advantage in this is that the gate-edge extension on the drain side, being a floating node, is somewhat susceptible to charge accumulation due to hot-carrier injection over time. By decoupling the drain-side gate-edge extension from t eh source-side gate-edge extension, the shift in transistor characteristics due the charge injection into this floating node will be minimized.

4.4 Sample DRAM Embodiments

In another class of alternative embodiments of the present invention, the capability described is used to configure an improved single-transistor DRAM cell using only a single layer of polysilicon. For example, the polysilicon layer can be used for the capacitor bottom plate and for the gates of pass transistors. Since the capacitor is over field oxide it will have better charge retention and will save area. An interlevel oxide/nitride is deposited and patterned, as described above, so that it is removed from gates and source/drains of the pass transistors. A direct reaction step, like that described above, is now used to form titanium silicide on gates and source/drains of the pass transistor, and form titanium nitride as the top plate of the capacitor. The TiN is patterned and etched to keep TiN as the top plate of the capacitor and to connect the top plate of the capacitor to the drain of the pass transistor. (In the preferred embodiment of this design, the roles of the bottom and top capacitor plates are opposite to current designs. The polysilicon storage plate is held at 5V, and the charge is stored on the TiN plate, which is almost completely encased in dielectric except for the drain connection. However, alternatively and less preferably, the storage plate could be held at ground instead.) Thus, this embodiment advantageously provides a DRAM cell which is more compact and has lower leakage than conventional DRAM cells, and yet can be made using a much simpler fabrication prcoess.

Figure 4A:
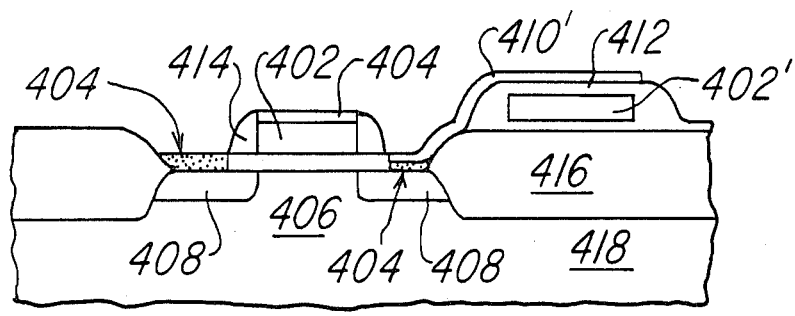
FIGS. 4A and 4B show examples of DRAM cells built according to the present invention, wherein only one level of polysilicon is required.
Figure 4B:
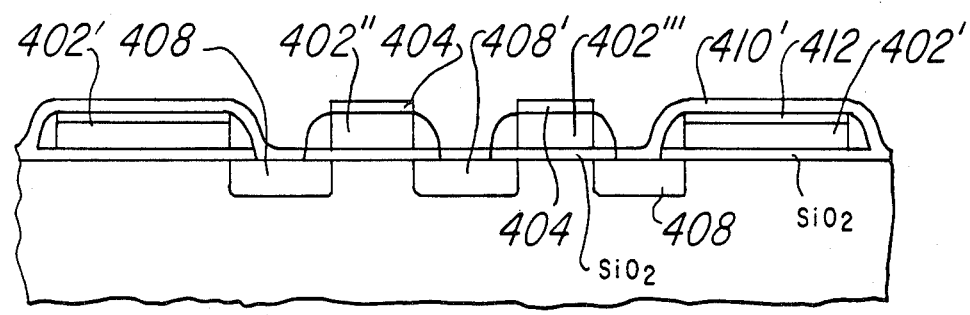

Examples of this class of embodiments are shown in Figures 4A and 4B. In FIG. 4A, polysilicon layer 402 (capped with $TiSi_2$ 404, as are the source/drain diffusions 408) provides the gate of the pass transistor 406. One of the source/drain diffusions 408 provides a diffused bit line, and a local interconnect line 410, which predominantly comprises TiN (which may be offstoichiometric, as discussed elsewhere), makes ohmic contact to the other source/drain diffusion 408 to and extends to form top capacitor plate 410'. The capacitor dielectric is a composite oxide/nitride layer 412, and the bottom plate of the capacitor is provided by another polysilicon plate 402' (which is another portion of the same thin film layer which provides the gate 402, and which sits on top of a field oxide 416 (preferably underlain by a channel stop implanted 418)). The polysilicon plate 402', however, is not clad by a silicide layer, since it is covered by the dielectric 412 when the titanium metal is deposited. Polysilicon regions 402 and 402' are ringed by sidewall oxide filaments 414, which prevent shorting at the corners of the gates 402.

FIG. 4B shows a different class of embodiments, wherein the capacitor bottom plate 402' also provides field plate isolation (that is, the bottom plate 402' is held at an average voltage which keeps the silicon beneath it depleted, so that the parasitic MOS transistor beneath this plate is kept turned off, preventing lateral leakage currents). FIG. 4B shows two bits of memory: the pass gate 402" is separate from the pass gate 402'''. So that bit line diffusion 408' can act as the source of either of the two pass transistors shown. This embodiment is particularly advantageous in that it is not necessary to grow the field oxide 416, so that the corresponding penalty of lateral encroachment (and area inefficiency) is avoided. It is most preferable to hold the polysilicon 402' at 5V (or at $V_{DD}$, if less than 4V), since this permits designers to use familiar sense level amplifiers; to accomplish this, the silicon below polysilicon plates 402' must have a doping level such that it will not turn on when 5V is applied to the plate 402'. Most preferably, this is done by performing a masked implant to increase the threshold voltage under polysilicon plates 402' (or under enough of plates 402' to provide good isolation), but not under polysilicon gates 402" and 402'''.

The dielectric under the field plates 402' is preferably the same as the gate oxide (for process simplification); but alternatively an additional masking step could be used to provide a dielectric which is thicker and/or has a different composition than the gate dielectric.

4.5 Sample Analog Device Embodiments

Figure 2A:
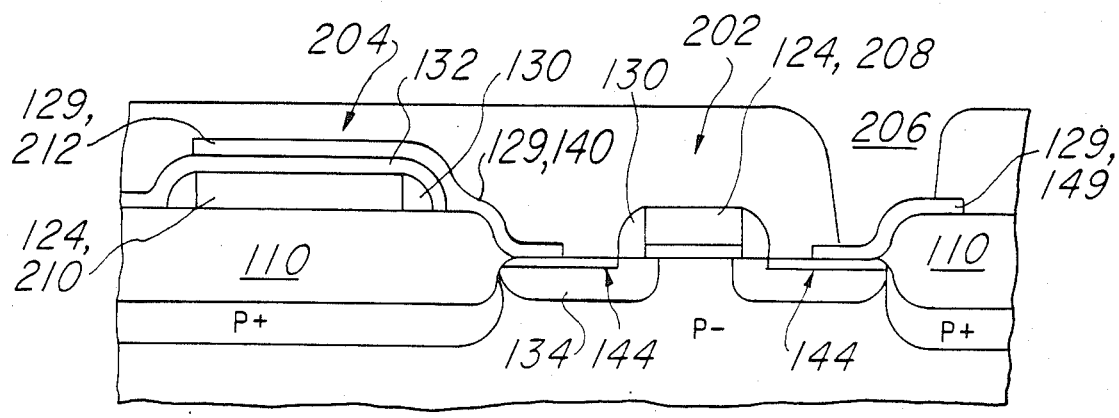
FIG. 2A shows a sample analog circuit according to a further class of embodiments of the present invention, including a capacitor having a TiN top plate and a polysilicon bottom plate.
Figure 2B:
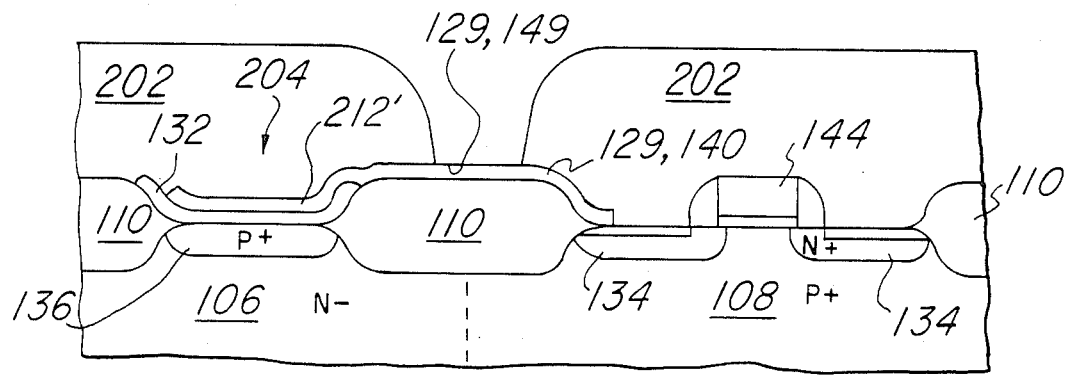
FIG. 2B shows another sample analog circuit including a capacitor having a TiN top plate and a bottom plate in heavily doped silicon substrate (doped with the source/drain implant).

Another class of embodiments where the present invention provides substantial advantages is in circuits using capacitors, and particularly in analog circuits using capacitors. FIGS. 2A and 2B show two sample embodiments of this type.

FIG. 2A shows a small part of a switched-capacitor filter, wherein a pass transistor 202 is used to switch capacitor 204 into and out of connection with node 206 (which in the example shown is a metal output line). The gate 208 of transistor 202 and the bottom plate 210 of capacitor 204 are both formed as portions of a first patterned thin film conductor 124 (polysilicon in this example), and a second patterned thin film conductor layer 129 (preferably comprising a large fraction of titanium nitride) provides the top plate 212 of capacitors 204, local interconnects 140 (linking, for example, the top plate of the capacitor 204 to the source/drain output 134), and contact pads 149. Interlevel dielectric 132 (in this example an oxide/nitride stack) is the capacitor dielectric.

Such capacitors can also be used for a wide variety of other purposes in integrated circuits; for example, they may be used for bootstrapping word lines in DRAMs.

Figure 6:
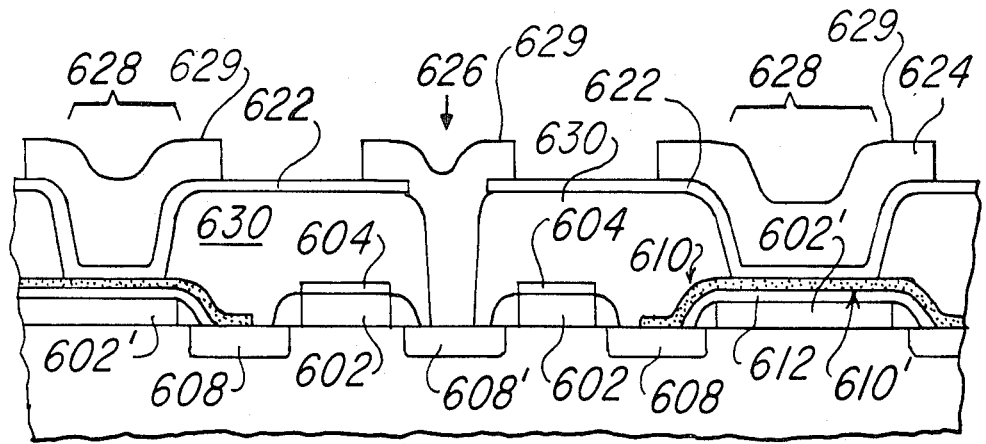
FIG. 6 shows an example of a class of embodiments with stacked capacitors.

FIG. 2B shows another example of a gated capacitor structure, wherein the pass transistor 202 now accesses a substrate capacitor 204'. Like capacitor 204, capacitor 204' has a top plate 212' formed from a second patterned thin film conductor layer 129 (preferably comprising a large fraction of titanium nitride) which also provides local interconnects 140 (linking, for example, the top plate of the capacitor 204' to the output source/drain 134), and contact pads 149. Interlevel dielectric 132 (in this example an oxide/nitride stack) is against the capacitor dielectric. However, the bottom plate of the capacitor is provided by the substrate: in this example, the predetermined location of this capacitor is exposed to the p+ source/drain implant, to provide heavy doping at the lower plate of the capacitor, and the capacitor is formed in an n-well 106 (which may contain the capacitor only, or may also contain active devices). Another class of embodiments to achieve increased capacitance is shown in FIG. 6. In this sample embodiment, pass transistor gates 602 (which are polysilicon clad by silicide 604) permit connection of a first source/drain 608' to either of second source/drains 608, which are ohmically contacted by respective local interconnect lines 610 (which predominantly comprise TiN (which may be off-stoichiometric, as discussed elsewhere)), which extend to form middle capacitor plates 610'. The lower capacitor dielectric is a composite oxide/nitride layer 612, and the bottom plate of the capacitor is provided by another polysilicon plate 602' (which is another portion of the same thin film layer which provides the gates 602). (Polysilicon regions 602 and 602' are ringed by sidewall oxide filaments 614 to prevent shorting and improve topography.) The middle capacitor plate 610' is also capacitively coupled, through upper capacitor dielectric 622, to a capacitor top plate 624 in metal. To fabricate this embodiment, after the polysilicon, silicide-, and local interconnect structures have been formed, interlevel dielectric 530 is deposited and planarized, and a two-step contact etch process is performed. First, large contact windows 628 are etched down to the local interconnect (titanium nitride) layer 610' in desired capacitor locations, and an oxide/nitride layer (preferably) is deposited to form the upper capacitor dielectric 622. Another masked contact etch is then used to cut contacts to moat (in this example, to diffusion 608') or (if desired) to polysilicon 602, in predetermined ohmic contact locations. Metal 629 (e.g. Al:Si) can then be deposited and etched to produce a structure such as that shown.

4.6 Twin-Poly Embodiments

Most of the embodiments discussed above advantageously permit the virtues of structures normally requiring two level of polysilicon to be attained with only one level. However, the present invention also provides great benefits in embodiments which use two layers of polysilicon, or which combine a layer of polysilicon (or silicide) with another underlying thin film patterned conductor layer. In particular, the present invention advantageously permits the virtues of many structures normally requiring three levels of polysilicon to be attained with only two levels. For example, another embodiment of the present invention alters conventional analog processes by cutting the required capacitor area approximately in half, at no great increase in processing complexity. Every capacitor can have its capacitance almost double, by adding atop the top plate of the capacitor (which will normally be part of the second polysilicon layer, while the capacitor bottom plates are part of the first polysilicon layer) an interlevel dielectric overlaid by another patterned thin film conductor layer, which predominantly comprises titanium nitride (including alternatively off-stoichiometric variations thereof).

A further advantage of this class of embodiments is that the local interconnect layer can make contact to n+ source/drains. p+ source/drains, poly 1 (i.e. the first patterned thin film conductor layer), and poly 2 (i.e. the second patterned thin film conductor layer), in any desired pattern, in addition to providing (at the cost of patterning the second interlevel dielectric) a second layer of capacitors. This second layer of capacitors is independent of the first layer: it can be used simply to halve the area of large capacitors, but it can also be used independently in circuit design to reduce the number of contacts required in complex circuits, such as custom switched-capacitor filter layouts, or even to configure charge-coupled circuits. For example, by appropriate patterning of the interlevel dielectric, capacitors may be made not only from the local interconnect layer to the poly 2 layer, but also (in any desired combination) from the local interconnect layer to the poly 1 layer and/or from the local interconnect layer to substrate.

In the preferred processing embodiments to make such device structures, a short oxide/nitride etch is performed before the titanium deposition and silicidation steps, so that the first interlevel dielectric is removed from all areas of poly 1 which are not covered by the poly 2 layer (nor by its sidewall filaments, if these are used). Thus, the ensuing silicidation reaction step will form titanium silicide on: all portions of the substrate which are not covered 1) by the patterned second interlevel dielectric, 2) by the poly 1 layer (nor its sidewall filaments, if these are used), 3) nor by the poly 2 layer (nor its sidewall filaments, if these are used). This advantageously provides a convenient way to form silicides on (and thereby reduce the sheet resistance of) four critical pattern layers at once.

Figure 3:
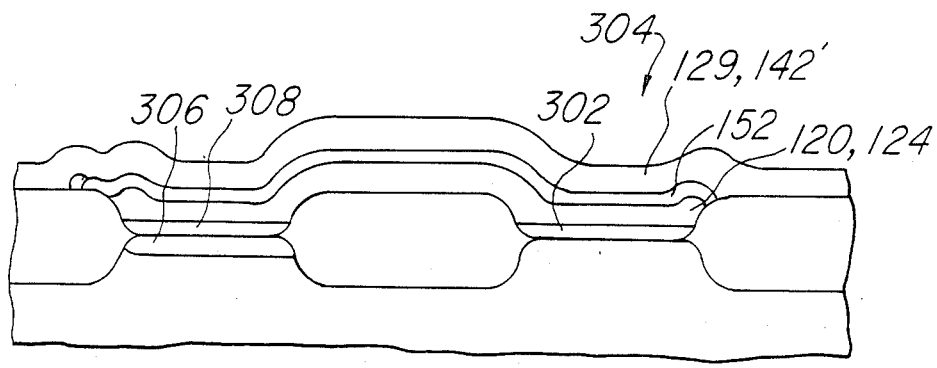
FIG. 3 shows a sample electrically erasable nonvolatile memory cell constructed according to the present invention.

Another sample embodiment using both poly 1 and poly 2 layers configures a different type of EEPROM, unlike that shown in FIG. 3. That is, one conventional type of EEPROM uses an additional thin film layer (a poly 1 layer) which underlies a portion of the poly 2 layer from the floating gates are constructed. Preferably the poly 1 and poly 2 layers both have asperities on their upper surfaces to promote tunneling, so that programmation occurs by tunneling of electrons from poly 1 to poly 2, and erasure occurs by tunneling of electrons from poly 2 to poly 3 (the layer (normally polysilicon) which includes the control gates). The present invention provides a way to substantially improve this structure, by making the control gate in the local interconnect layer 129, separated from the poly 2 layer by portions of a patterned interlevel dielectric. The process to accomplish this is very similar to that just described, except that the first and second polysilicon layers (the poly 1 and poly 2 layers) may optionally be made with asperities on their upper surfaces to enhance tunneling.

A further class of related embodiments uses two polysilicon layers, with two titanium metal deposition steps and two local interconnect etching steps, to provide four independently patterned conductive layers: first polysilicon, first TiN, second polysilicon, and second TiN. The first polysilicon and first TiN layers will be combined in some locations to form a TiN/TiSi$_2$/polysilicon stack having substantially lower sheet resistance than that which would normally result even from the parallel combination of identical geometries in the two layers, and similarly the second polysilicon and TiN layers can be combined in some locations to form a TiN/TiSi$_2$/polysilicon stack having substantially lower sheet resistance than that which would normally result from the parallel combination of identical geometries in the two.

Some processing economies can be achieved in this class of embodiments, so that, in a device structure where this many conductive layers are useful, this may provide a way to achieve them. For example, some conventional processes use a triplepoly double-metal structure; this class of embodiments can replace such conventional processes, in some applications, with a double-poly single-metal process which also has two local interconnect levels.

A sample summary of the processing steps for one such embodiment is as follows:

Tank and moat formation are conventional.

A first gate oxide is grown, and a first polysilicon layer is deposited, patterned, and etched.

Sidewall oxides ar e formed on the first polysilicon layer.

A first interlevel nitride is deposited, patterned, and etched.

Ti is deposited overall, and reacted at 675C in a nitrogen atmosphere. This provides a structure with a TiN/nitride/polysilicon in some locations, polycide in others, and TiN where no polysilicon existed.

A first interlevel oxide is deposited.

A second gate oxide is grown (note that this second gate oxide may have a different thickness from the first gate oxide), and second polysilicon layer is deposited, doped, patterned, and etched. (Optionally, the second polysilicon layer may be p+ and the first polysilicon layer n+, or vice versa. By exploiting the resulting difference in work-function, device characteristics of NMOS and PMOS can both be optimized. This may be used to avoid buried channel operation and to reduce the masks required for VT-adjust implants; and will also optionally provide additional device types. for example, in data conversion devices it may be desirable to use buried-channel devices for low noise analog devices, and surface channel NMOS and PMOS devices for logic.)

A second interlevel nitride is deposited, patterned, and etched.

Sidewall oxides are formed on the second polysilicon layer.

Titanium is deposited and reacted at 675C (or less).

A patterned etch is now used to cut both local interconnect layers. (This optional process economy saves steps, but will of course impose some constraints on the overlaps permissible among the various layers.)

Source/drains are now implanted, and a high-temperature anneal is then used to activate the source/drain implants and lower the sheet resistance of the silicide cladding.

Processing then continues with various conventional steps: MLO deposition and planarization, contact etch, metal deposition and etch, etc.

4.7 Some Optional Process Variations 4.7.1 Alternatives for TiN Formation:

There are three principal variations in the method for forming the second patterned conductive thin film layer (local interconnect layer) 129 after the patterned interlevel dielectric 132 is in place:

The TiN which is formed during a nitrogen-atmosphere direct-react slicing process can be patterned and etched.

A cap can be formed over a metallic titanium layer before the anneal which effects silicidation. This is the presently preferred embodiment. The conductive material in the local interconnect lines will be non-stoichiometric TiN (titanium-rich, and with a substantial admixture of oxygen if the cap layer is an oxide), but it will work.

Less preferably, the Ti layer which is to be converted to TiN can be patterned and etched before conversion. This technique could be applied, for example, to the use of TiN as a gate level where Ti is deposited on the gate oxide, patterned, and etched. Subsequent reaction in a nitrogen containing ambient would result in TiN gate electrodes. An advantage of this class of embodiments is that titanium can be etched with very high selectivity to $SiO_2$ (more easily than TiN can). Thus, TiN local interconnect can be formed by forming Ti straps which overlap gate and moat regions, followed by heating in a nitrogen containing ambient to product TiN connecting the moat and gate regions across the intervening oxide region and the TiN/$TiSi_2$ in the regions where the straps cross silicon regions (substrate or polysilicon gates). (This would normally be done after a $TiSi_2$ cladding of the gates and moats, but this is not strictly necessary.)

TiN can be deposited, either by CVD or by sputtering. This is the least preferred method, since it does not provide the convenience of silicide-clad moats and polysilicon, but this method would still enable some of the advantages of the invention.

Additional details regarding implementation of these alternatives will now be described.

A sample process flow is as follows:
After S/D anneal, deposit pure titanium (1000 Å)
Deposit low temperature silicon nitride/silicon dioxide layer (400 Å/800 Å)
Silicide react (675C, 30 min)
Plasma etch nitride/oxide layer
Selectively strip unreacted titanium (and nitride/oxide filaments) by wet chemical etch
Silicide anneal (800C, 30 min)

Another sample process flow is as follows:
After S/D anneal, deposit 0.1 μm of pure titanium
Deposit low temperature (300C) $SiO_2$
Silicide reaction, 675C for 30 min in $N_2$
Unmasked plasma etch of oxide layer (using a standard fluoro-etch chemistry as commonly used for oxide/nitride etching)
Selective wet strip of Ti reaction products on oxide regions ($H_2O_2/H_2SO_4$, or $H_2O_2/NH_4OH$ with ultrasonic agitation)
Silicide anneal Another sample process flow is as follows:
After S/D anneal, deposit 0.1 μm of pure titanium
Deposit low temperature (300C) $SiO_2$
Silicide reaction. 700C for 15 sec (transient heating) in $N_2$
Unmasked plasma fluoro-etch of oxide layer
Selective wet strip of Ti reaction products on oxide regions ($H_2O_2/$ $H_2SO_4$, or $H_2O_2/$ $NH_4OH$ with ultrasonic agitation)
Silicide anneal The cost of this version of the process is an extra 0.1 μm plasma oxide deposition and an unmasked dry etch step. However, the benefit of eliminating the sensitivity of the process to ambient gas contamination, and therefore the improved reproducibility of the process, probably outweighs the disadvantage.

Thus, a patterned local interconnect layer can be obtained by depositing and patterning a thin hardmask before the step of reacting the titanium in a nitrogen atmosphere. For example, a 1000 Å layer of plasma oxide (i.e. silicon oxides deposited in a plasma reactor at low temperature, e.g. 300C, to produce a fairly low density oxide) can be deposited over the titanium metal, etched to mask local interconnects in the desired pattern (using an oxide etch such as $CHF_3+C_2F_6+O_2$ He, which is selective to titanium, so that the titanium layer under the plasma oxide provides an etch stop) and left in place during the reaction which produces TiN and $TiSi_2$ compounds. There will be significant reaction between the titanium metal and the plasma oxide, so that (in one example where rapid thermal annealing was used) Rutherford Backscattering Analysis has revealed that the titanium metal under the plasma oxide layer has an oxygen to titanium atomic ratio of 0.69:1 (as compared to an oxygen to titanium atomic ratio, for titanium which lies on field oxide and is exposed to the nitrogen atmosphere during the reaction step, of around 0.25:1). This high oxygen content is not enough to destroy the metallic conduction properties of the titanium, but does impart substantial resistance to etching ($TiO_2$ is an extremely stable compound which is very difficult to etch). The metallic titanium remaining can be converted to titanium nitrides and/or silicides by a subsequent reaction step. It has been experimentally found that this process does provide a local interconnect with valuable properties including conductivity, etch stop capability, and providing a barrier to lateral diffusion, although the interconnect thus provided is not initially pure TiN, at least where rapid thermal annealing is used for the silicidation (its atomic fraction of nitrogen is much less than 1%, except possibly at the corners of the plasma oxide mask). Note that the plasma oxide mask remains in place through the TiN etching step.

The additional fraction of oxygen introduced by this alternative embodiment can be highly advantageous in at least two ways. First, since $TiO_2$ is so chemically inert, it adds to the durability of the local interconnect layer as an etch stop at contact hole locations. Second, the etching of the TiN layer becomes simpler: a higher fraction of oxygen in the layer under the hardmask makes it possible to wet etch the TiN without undercutting the hardmask patterned interconnects too much. A sample wet etch for this purpose would be $NH_4OH + H_2O_2$ in water at room temperature, but many other wet etch chemistries could be used.

That is, titanium silicide typically gives a rough surface, so it is a pleasant surprise that the titanium under the oxide mask reacts with the oxide mask to form titanium oxides as a surface sealant. This surface $TiO_2$-rich layer avoids in-migration of etchants during a wet etch and thus permits the simple wet etch process described.

In an alternative version of the embodiment, the plasma oxide hardmask is stripped after the silicidation heating step (the 675C step in the example given) and before the annealing step (the 800C step in the example given). By ensuring that a nitrogen atmosphere is present during the high-temperature step, any possibility of silicon and dopant outdiffusion is suppressed, and the remaining metallic titanium which the oxide mask protected from the first heating step will substantially all be converted to nitrides, providing additional diffusion barrier advantages as described above. Another (less preferred) alternative way (for NMOS process or some CMOS processes with two types of polysilicon) to convert the patterned titanium into a stable conductor is to perform the high-temperature anneal in an atmosphere which does not include nitrogen, so that silicon outdiffusion can convert the titanium metal in the local interconnect straps to titanium silicide.

Note that the oxide hardmask does not strictly have to be stripped at all—optionally it can be left in place through the whole remainder of the process.

A very important advantage of this embodiment is that no TiN etch is required—instead the TiN is simply dipped out using a standard clean-up solution. Thus this embodiment may be the most suitable of all for transfer into a manufacturing environment.

Another advantage of this embodiment is that it is very scalable, since the geometry-limiting step is simply an oxide etch.

After the TiN layer has been patterned as desired, a second annealing step is preferably used to lower the sheet resistance of the silicide layers to one $\Omega/\square$ or less. This second heat treatment step is preferably performed at 800 degrees C for 300 minutes in an argon atmosphere at atmospheric pressure, but these parameters may be varied. For example, the annealing temperature could be in the range of 750 degrees of 875 degrees, or even wider, and the other processing parameters of this step can also be widely varied.

In fact, the silicidation may optionally be performed as a transient heating step, using a flash lamp or laser heating or other transient heating methods. This tends to leave a higher atomic fraction of unreacted titanium in the titanium nitride layers, which as noted may facilitate patterning, and may be disposed of in the later anneal.

After the final anneal which lowers the sheet resistance of the silicide has been performed, processing then proceeds in conventional fashion. For example, an interlevel dielectric could now be deposited, such as 1000 Å of low pressure CVD pad oxide followed by a micron of borophosphosilicate glass. Contact holes would then be cut in the interlevel dielectric and a patterned metal layer formed to achieve a desired pattern of electrical interconnections.

The only modification to subsequent processing which is preferably used is that the contact etch which cuts through the interlevel dielectric is preferably an etch chemistry which will stop on titanium nitride. This means that the titanium nitride layer 22 can be used as a diffusion barrier at the bottom of contacts, and also that the contacts to moat can be allowed to overlap onto the field oxide regions 26, since the titanium nitride 22 will prevent undercutting of exposed portions of field oxide 26 during the contact etch. Normal fluorine-based oxide etch chemistries, such as $CF_4$ plug 5% $O_2$, are reasonably selective to TiN.

4.7.2 Other Process Modifications

The polysilicon gate layer so frequently referred to in the present application does not have to be strictly polysilicon, but can be other materials which are substantially polycrystalline or amorphous and contain a large fraction of silicon. For example, deposited silicides or polysilicon/silicide sandwich structures could less preferably be substituted, and further sandwich structures which have analogous deposition and electrical properties in future processes to the place of polysilicon in present processes are intended to be comprehended also.

Similarly, the various gate dielectric and interlevel dielectric layers referred to do not have to be silicon dioxide, silicon nitride, and combinations thereof.

Similarly, the metal layer so frequently referred to as titanium does not have to be strictly pure titanium, but may instead be any one of a wide range of titanium alloys or pseudo-alloys, as long as their chemistry is dominated by titanium: Ti:V and Ti:Al alloys are certainly included here, and other intermetallic compositions such as Ti:Y or Ti:W may also be usable.

It is possible that the teachings of the present invention can be extended to metals other than titanium. In general, any metal which
1. forms a conductive silicide.
2. will not allow silicon diffusion (at temperatures suitable for silicide formation) if the metal is passivated with oxygen, and
3. can reduce silicon oxides (at temperatures suitable for silicide formation). is a candidate for use of the present invention. Although titanium is the only metal so far known to optimally meet these requirements, and the present invention does give tremendous advantages when used with titanium (or titanium alloys), the teachings of the present invention could be applied to other suitable metals.

In addition, it may also be possible to adapt some of the teachings of the present invention to other "direct-react" processes. That is, other processes where a cladding process is performed by a blanket reaction which forms conductive cladding wherever certain materials are exposed, and provides a useful local interconnect material in other locations, may be adaptable to obtain some of the advantages of the present invention. Some candidates for such adaptation are: deposition and reaction of another refractory metal, (such as tungsten) to form silicides over exposed silicon and leave conductive metal (or a conductive compound, such as a nitride or partially oxidized reaction product) elsewhere. Similarly, it may alternatively be possible to use a gas phase source (such as halides or organometallic compounds) in place of the solid titanium layer used in the preferred embodiment. However, as discussed above, the principal preferred embodiments have tremendous proven advantages, and these modifications are much more conjectural.

As will be appreciated by those skilled in the art, the present invention can be widely modified and varied, and its scope is not limited except as specified in the allowed claims.

What is claimed is:

1. An integrated circuit device comprising:
    a substrate;
    device isolation regions defining predetermined moat areas of exposed semiconducting material;
    a plurality of active devices near the surface of said moat areas, said active devices including portions of a first patterned thin film conductive layer; and
    a local interconnect layer comprising a patterned thin film consisting substantially of titanium nitride, some portions of said patterned local interconnect thin film interconnecting predetermined portions of said moat regions over said device isolation regions, and some portions of said patterned local interconnect thin film overlying a relatively thin thin film insulator over at least some respective portions of said first patterned thin film conductive layer to define capacitors.

2. The device of claim 1, wherein said local interconnect layer also comprises at least 5% atomic of oxygen.

3. The device of claim 1, wherein said local interconnect layer is less than 2000 Angstroms thick.

4. The device of claim 1, wherein said local interconnect layer consists essentially of titanium nitride.

5. The device of claim 1, wherein all portions of said local interconnect layer which are more than 50 Angstroms away from an upper or lower surface thereof consist of more than 90% titanium nitride.

6. The device of claim 1, wherein said portions of said local interconnect thin film make contact to titanium silicide layers at the surface of moat regions.

7. The device of claim 1, wherein said first conductive thin film layer is polycrystalline and comprises a substantial fraction of silicon.

8. An integrated circuit device comprising:
    a substrate;
    device isolation regions defining a plurality of moat areas of semiconducting material;
    an active device near the surface of one of said moat areas, said active device including a portion of a first patterned thin film conductive layer; and
    a second patterned thin film conductive layer consisting predominantly of titanium nitride, a portion of said second conductive layer extending over one of said device isolation regions to make ohmic contact between portions of separate ones of said moat areas, and a portion of said second conductive layer overlying a relatively thin thin film insulator over a portion of one of said moat area to define a capacitor.

9. The device of claim 8, wherein said substrate comprises both PMOS moat regions comprising p+ source/drain regions therein and NMOS moat regions comprising n+ source/drain regions therein, and wherein said titanium nitride layer is patterned to provide predetermined connections from predetermined ones of said p+ source/drain regions to predetermined ones of said n+ source/drain regions.

10. The device of claim 8, wherein some portions of said second conductive layer make ohmic contact to predetermined portions of said first conductive layer.

11. The device of claim 8, wherein said second conductive layer also comprises at least 5% atomic of oxygen.

12. The device of claim 8, wherein said second conductive layer is less than 2000 Angstroms thick.

13. The device of claim 8, wherein said second conductive layer consists essentially of titanium nitride.

14. The device of claim 8, wherein all portions of said second conductive layer which are more than 50 Angstroms away from an upper or lower surface thereof consist of more than 90% titanium nitride.

15. The device of claim 8, wherein said portion of said second conductive layer which makes contact to said first moat area is in contact with a titanium silicide layer at the surface of said first moat area.

16. The device of claim 8, wherein said first conductive thin film layer is polycrystalline and comprises a substantial fraction of silicon.

17. The device of claim 8, wherein said moat regions are substantially covered by an interlevel dielectric having contact holes filled with metal therein, said metal in said contact holes making contact to portions of said second conductive layer at the bottom thereof.

18. The device of claim 8, wherein said thin film insulator consists essentially of a combination of silicon dioxide and silicon nitride.

19. The device of claim 18, wherein said thin film insulator comprises a layer of silicon nitride over a layer of silicon dioxide.

20. An integrated circuit device comprising:
    a substrate;
    device isolation regions defining predetermined moat areas of exposed semiconducting material;
    a plurality of active devices near the surface of said moat areas, said active devices including portions of a first patterned thin film conductive layer; and
    a second patterned thin film conductive layer consisting predominantly of titanium nitride, some portions of said second conductive layer making ohmic contact to predetermined p+ portions of said moat areas, some portions of said second conductive layer making ohmic contact to predetermined n+ portions of said moat areas, and some portions of said second conductive layer overlying a relatively thin thin film insulator over at least some respective portions of said first patterned thin film conductive layer to define capacitors.

21. The device of claim 20, wherein said second conductive layer also comprises at least 5% atomic of oxygen.

22. The device of claim 20, wherein said second conductive layer is less than 2000 Angstroms thick.

23. The device of claim 20, wherein said second conductive layer consists essentially of titanium nitride.

24. The device of claim 20, wherein all portions of said second conductive layer which are more than 50 Angstroms away from an upper or lower surface thereof consist of more than 90% titanium nitride.

25. The device of claim 20, wherein said second conductive layer makes contact to titanium silicide layers at the surface of said moat regions.

26. The device of claim 20, wherein said first conductive thin film layer is polycrystalline and comprises a substantial fraction of silicon.

27. The device of claim 20, wherein said moat regions are substantially covered by an interlevel dielectric having contact holes fillers with metal therein, said metal in said contact holes making contact to portions of said second conductive layer at the bottom thereof.

28. The device of claim 20, wherein said thin film insulator consists essentially of a combination of silicon dioxide and silicon nitride.

29. The device of claim 28, wherein said thin film insulator comprises a layer of silicon nitride over a layer of silicon dioxide.

30. An integrated circuit comprising: a first conductive layer, said first conductive layer being polycrystalline and consisting essentially of silicon;

a thin film dielectric overlying some but not all areas of said first conductive layer;

a second conductive layer, consisting predominantly of titanium nitride, overlying at least a part of said dielectric at a location where said dielectric overlies said first conductive layer;

wherein said first conductive layer further comprises an overlying layer comprising a metal silicide, said silicide layer overlying substantially all of said first conductive layer except where either said thin film dielectric or said second conductive layer overlie said first conductive layer.

31. The integrated circuit of claim 30, wherein said second conductive layer also comprises at least 5% atomic of oxygen.

32. The integrated circuit of claim 30, wherein said second conductive layer is less than 2000 Angstroms thick.

33. The integrated circuit of claim 30, wherein said second conductive layer consists essentially of titanium nitride.

34. The integrated circuit of claim 30, wherein all portions of said said second conductive layer which are more than 50 Angstroms away from an upper or lower surface thereof consist of more than 90% titanium nitride.

35. The integrated circuit of claim 30, wherein said said second conductive layer makes contact to titanium silicide layers at the surface of said moat regions.

36. The integrated circuit of claim 30, wherein said thin film insulator consists essentially of a combination of silicon dioxide and silicon nitride.

37. The integrated circuit of claim 36, wherein said thin film insulator comprises a layer of silicon nitride over a layer of silicon dioxide.

* * * * *